(12) United States Patent
Kuang et al.

(10) Patent No.: US 9,893,183 B2
(45) Date of Patent: Feb. 13, 2018

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Shin-Jiun Kuang, Hsinchu (TW); Tsung-Hsing Yu, Taipei (TW); Yi-Ming Sheu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 72 days.

(21) Appl. No.: 14/328,061

(22) Filed: Jul. 10, 2014

(65) Prior Publication Data
US 2016/0013316 A1 Jan. 14, 2016

(51) Int. Cl.
*H01L 29/78* (2006.01)
*H01L 29/08* (2006.01)
*H01L 21/02* (2006.01)
(Continued)

(52) U.S. Cl.
CPC ...... *H01L 29/7848* (2013.01); *H01L 21/0243* (2013.01); *H01L 21/0262* (2013.01);
(Continued)

(58) Field of Classification Search
CPC . H01L 29/7848; H01L 29/167; H01L 29/161; H01L 29/66477; H01L 21/30604;
(Continued)

(56) References Cited

U.S. PATENT DOCUMENTS

| 9,142,642 B2 | 9/2015 | Chen et al. |
| 2006/0214236 A1* | 9/2006 | Chien ............... H01L 29/165 257/387 |

(Continued)

FOREIGN PATENT DOCUMENTS

| CN | 103270597 A | 8/2013 |
| KR | 10-2013-0092346 | 8/2013 |

OTHER PUBLICATIONS

Office action issued by Korean Intellectual Property Office dated Oct. 31, 2016 for counterpart Korean application 10-2014-0195524.
English translation of the Office action issued by Korean Intellectual Property Office dated Oct. 31, 2016 for counterpart Korean application 10-2014-0195524.
Office action issued by Korean Intellectual Property Office dated Jul. 12, 2017 for counterpart Korean application 10-2017-0079054.
(Continued)

*Primary Examiner* — Ermias Woldegeorgis
(74) *Attorney, Agent, or Firm* — WPAT, P.C., Intellectual Property Attorneys; Anthony King

(57) ABSTRACT

Some embodiments of the present disclosure provide a semiconductor structure including a substrate and an epitaxy region partially disposed in the substrate. The epitaxy region includes a substance with a lattice constant that is larger than a lattice constant of the substrate. The concentration profile of a substance in the epitaxy region is monotonically increasing from a bottom portion of the epitaxy region to a of the epitaxy region. A first layer of the epitaxy region has a height to width ratio of about 2. The first layer is a layer positioned closest to the substrate, and the first layer has an average concentration of the substance from about 20 to about 32 percent. A second layer disposed over the first layer. The second layer has a bottom portion with a concentration of the substance from about 27 percent to about 37 percent.

14 Claims, 10 Drawing Sheets

(51) Int. Cl.
*H01L 29/66* (2006.01)
*H01L 29/165* (2006.01)

(52) U.S. Cl.
CPC .. *H01L 21/02532* (2013.01); *H01L 21/02579* (2013.01); *H01L 21/02639* (2013.01); *H01L 29/0847* (2013.01); *H01L 29/165* (2013.01); *H01L 29/66628* (2013.01); *H01L 29/66636* (2013.01)

(58) Field of Classification Search
CPC ........... H01L 21/02636; H01L 21/0257; H01L 29/0847; H01L 21/02532; H01L 21/26513; H01L 29/165
See application file for complete search history.

(56) References Cited

U.S. PATENT DOCUMENTS

| | | | |
|---|---|---|---|
| 2010/0314671 A1 | 12/2010 | Oyu et al. | |
| 2012/0153387 A1* | 6/2012 | Murthy | H01L 21/28512 257/335 |
| 2012/0181625 A1* | 7/2012 | Kwok | H01L 29/165 257/408 |
| 2013/0109144 A1 | 5/2013 | Kim et al. | |

OTHER PUBLICATIONS

U.S. Pat. No. 9,142,642 corresponds to KR20130092346.
Office Action from Chinese Patent Office dated Sep. 15, 2017, for corresponding China application 201510252597.3, which cites US2013/0109144, CN103270597A and US2010/0314671.

* cited by examiner

SEMICONDUCTOR STRUCTURE AND MANUFACTURING METHOD THEREOF

BACKGROUND

Scaling down of metal-oxide-semiconductor field effect transistors (MOSFETs) has enabled continued improvement in speed, performance, functional density, and production cost. One way to further improve MOSFET performance is through selective application of stress to a channel region of the transistor. Stress distorts (i.e., strains) semiconductor crystal lattice, and distortion, in turn, affects band alignment and lattice structure of a semiconductor.

To enhance the performance of metal-oxide-semiconductor (MOS) devices, stress may be introduced in the channel regions of the MOS devices to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

A commonly used method for applying compressive stress to the channel regions of PMOS devices is by growing SiGe stressors in the source and drain regions. Such a method typically includes the steps of forming a gate stack on a silicon substrate, forming spacers on sidewalls of a gate stack, forming recess in the silicon substrate and adjacent to the gate spacer, and epitaxially growing SiGe stressors in the recess. An annealing is then performed. Since SiGe has a greater lattice constant than silicon, it expands after annealing and applies a compressive stress to the channel region of the respective MOS device, which is located between a source SiGe stressor and a drain SiGe stressor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
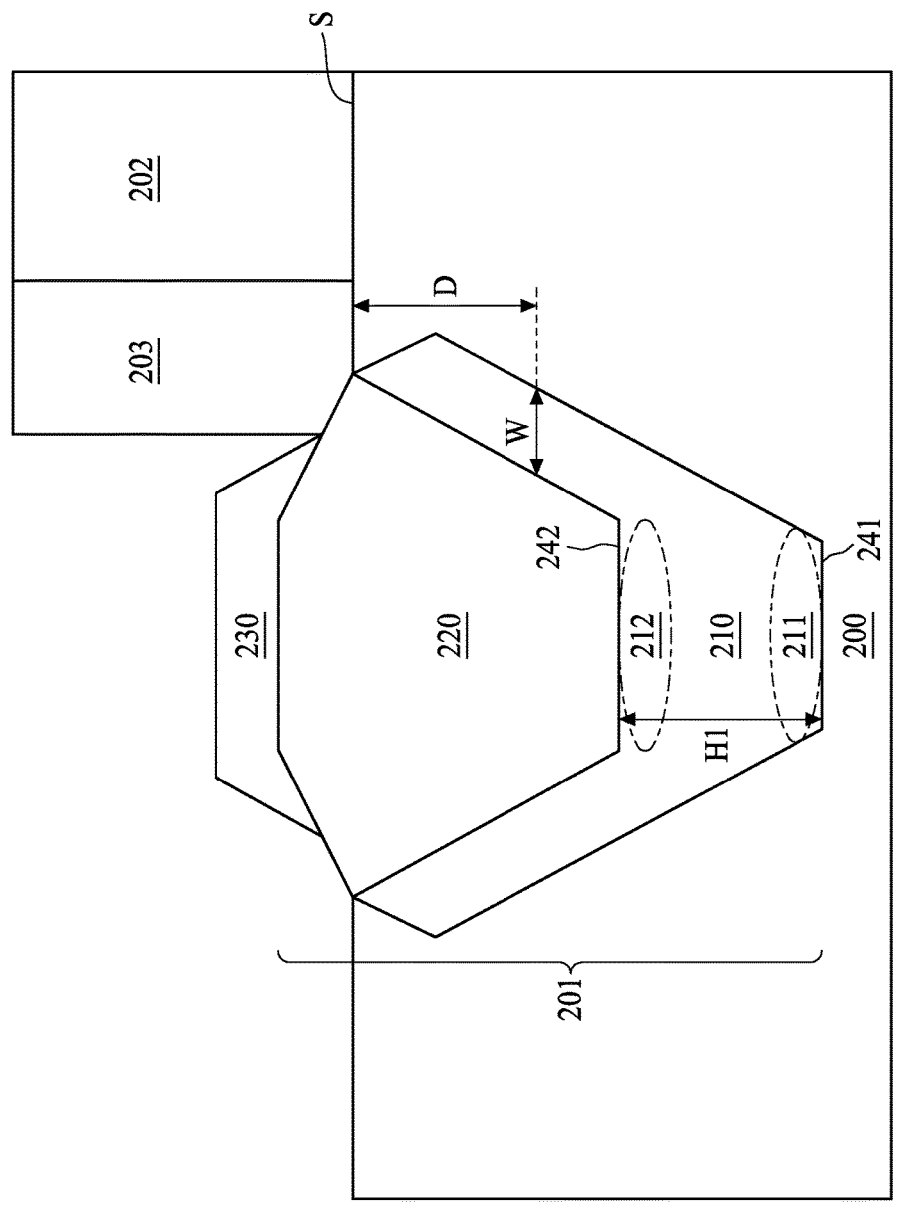
FIG. 1 is a cross sectional view of an epitaxy region next to a gate with detail about a first layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One way to increase a driving current of a transistor is by adding Ge in a source and drain region. However, increasing a concentration of Ge would also increase a leakage current. Another cause of a leakage current may be a dislocation formed around a lattice mismatch. A carrier may appear near the lattice mismatch regions to cause the leakage current or a charge accumulation.

The leakage current could contribute to an off drain current that reduces a MOS performance as a switch and also increases power consumption. Subthreshold leakage (including subthreshold conduction, gate-oxide leakage and reverse-biased junction leakage), which can consume upwards of half of a total power consumption of high-performance VLSI chips.

Although adding Ge concentration may increase stress, this may also increase a leakage current. One way to solve this is to form a multilayer region, each layer with a different Ge concentration in a source and drain region. By keeping a Ge concentration profile monotonically increasing, one can observe that as a Ge concentration of a bottom layer of the multilayer increases, a driving current and the leakage current also increases. However, there is a range in the Ge concentration profile where a driving current level rises faster than a leakage current level. There is also another range in the Ge concentration profile where a driving current level rises slower than a leakage current level. Therefore, depending on a specification requirement of a transistor, a suitable range of Ge concentration could be drawn to yield an optimum level of performance that is with a least amount of leakage and a maximum amount of driving current. With other factors such as a boron doping level and a thickness of the multilayer region held constant, a range of Ge concentration level could be found according to a limitation set forth on a leakage current and a driving current.

Several embodiments herein are illustrative examples but do not limit a scope of a disclosure and do not limit a scope of several appended claims. Embodiments of this disclosure include methods and apparatus for novel SiGe epitaxial source/drain regions with improved performance, reduced junction leakage, and reduced short channel effects. In some embodiments, controlling of a Ge concentration is for adjusting a lattice strain of a source and drain regions. A plurality of SiGe layers having different Ge concentration and different boron doping levels is formed. Finally, an in-situ epitaxial process continues to form a cap layer.

FIG. 1 depicts a cross-sectional view of selected features of an illustrative embodiment. An epitaxy region 201 refers to a source and drain region in a PMOS or an NMOS transistor in a CMOS device. The epitaxy region 201 includes a multilayer region disposed on a substrate 200 which, in some embodiments, may be a silicon substrate.

Alternatively, a substrate 200 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonite; or combinations thereof. Possible substrates also include a silicon-on-insulator (SOI) substrate. SOI substrates are fabricated using separation by implantation of oxygen (SIMOX), wafer bonding, and/or other suitable methods. Some exemplary substrates include an insulator layer. The insulator layer includes any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors, the insulator layer is a component (e.g., layer) of a silicon-on-insulator substrate. The substrate 200 may also include various doped regions depending on design requirements as known in an art (e.g., p-type wells or n-type wells). The doped regions are doped with p-type dopants, such as boron or BF2; n-type dopants, such as phosphorus or arsenic; or combinations thereof. The doped regions may be formed directly on the substrate 200, in a P-well structure, in an N-well structure, in a dual-well structure, or using a raised structure. The substrate 200 may further include various active regions, such as regions configured for an N-type metal oxide-semiconductor transistor device and regions configured for a P-type metal-oxide-semiconductor transistor device. The substrate 200 may also include various isolation features such as shallow trench isolation (STI) features formed in the substrate 200 to separate various devices.

An epitaxy region 201 is partially disposed on a substrate 200 with some portion of epitaxy region 201 below a surfaces level of substrate 200 and some portion above. The epitaxy region 201 is a raised source/drain structure to achieve low contact resistance by effectively increases surface areas of a source/drain region and therefore lowers a sheet resistance. In subsequent process operations, a semiconductor material, such as silicon germanium (SiGe), is epitaxially grown in epitaxy region 201 by a selective epitaxial growth (SEG). A semiconductor material may have a lattice constant inside epitaxy region 201 greater than a lattice constant inside substrate 200. Desired impurities may be doped while an epitaxial growth proceeds. After being annealed, SiGe restores its lattice constant, thus introducing compressive stresses to a channel region of a resulting MOS device. Since SiGe has a greater lattice constant than silicon, it expands after annealing and applies a compressive stress to a channel region, which is part of substrate 200 that is below a gate 202.

Still referring to FIG. 1, a first layer 210 may have a thicker bottom portion than a side portion. For example, there may be a bottom thickness H1 and a lateral thickness W. bottom thickness H1 is measured from a first interface 241 between a substrate 200 and first layer 210 to a second interface 242 between first layer 210 and a second layer 220. Lateral thickness W is measured at a depth D of about 10 nanometers below a surface S of a substrate 200, in a direction that is parallel to surface S as shown in FIG. 1. Lateral thickness W is measured from first interface 241 to second interface 242. In some embodiments, a ratio between bottom thickness H1 and lateral thickness W is around 2.

Since a Ge concentration of an epitaxy region 201 is monotonically increasing; therefore, controlling of a growth condition should be properly designed. A Ge concentration of epitaxy region 201 may be adjusted by adjusting a concentration of a Ge precursor flow, temperature, and pressure during a growing process. In one example, a first layer 210 is closest to a substrate 200 and includes an average Ge concentration from about 20 to about 32 percent. A percentage measured is an atomic percentage. The average Ge concentration is defined by dividing a sum of a Ge concentration at a top 212 and a Ge concentration at a bottom 211 of first layer 210 by 2.

Figure 2:
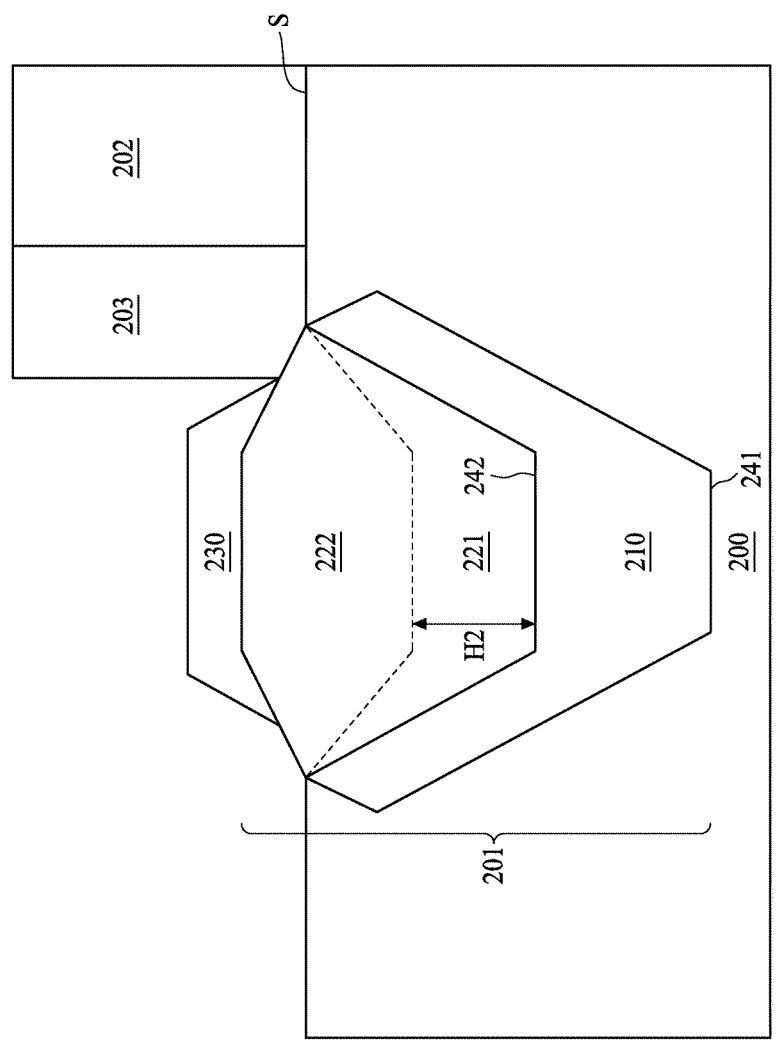
FIG. 2 is a cross sectional view of an epitaxy region next to a gate with detail about a second layer, in accordance with some embodiments.

Referring to FIG. 2, a second layer 220 in FIG. 1 is divided into a top portion 222 and a bottom portion 221. A second layer 220 includes a higher Ge concentration than a first layer 210. The bottom portion 221 may have a uniform Ge concentration. The uniform Ge concentration at the bottom portion 221 may be about 27, 31, or 37 percent. A different growing condition would apply to the bottom portion 221. A Ge concentration at bottom portion 221 may refer to as a starting concentration. In some embodiments, bottom portion 221 has a greater Ge concentration than an average Ge concentration in a first layer 210 to have a monotonically increase of Ge concentration.

Referring to FIG. 2, in some embodiments, a top portion 222 and a bottom portion 221 may have different doping concentrations. A doping concentration is monotonically increasing from a bottom portion 221 to a top portion 222. For example, a top portion 222 may be doped with boron having a concentration of about $2.0E20/cm^3$ and bottom portion 221 may be doped with boron having a concentration of about $1.9E20/cm^3$. In further example, top portion 222 may be doped with boron concentration of about $2.1E20/cm^3$ and bottom portion 221 may be doped with boron concentration of about $2.0E20/cm^3$. Whichever combination of a doping concentration may be arranged to yield a most applicable result for optimizing a performance of a device. Wherein bottom portion 221 may be a thin film having a vertical thickness H2 of about 10 or 12 nanometers. A vertical thickness H2 in bottom portion 221 may be shorter than a bottom thickness H1 in a first layer 210. However, a thickness of top portion 222 may not have a limited boundary, as long as the Ge and boron concentration profile is monotonically increasing. Second layer 220 may also include three, four, or plurality of portions, each with different average concentration of Ge or dopant. Each layer may include a uniform Ge or dopant concentration profile. A top most layer is a cap layer 230. Cap layer 230 is provided to lower a sheet resistance of a SiGe region to provide excellent contact characteristics for a contact to be formed to a source and drain regions. In some embodiment, a cap layer may include pure silicon doped with boron.

In some embodiment, an epitaxy region 201 may also include three, four, or plurality of layers, each with different average concentration of Ge or dopant. Each layer may include a uniform doping concentration. Each layer may include a uniform or a gradient Ge concentration. A Ge concentration profile is monotonically increasing from a layer below to a layer above. A boron doping concentration profile is monotonically increasing as well. For example, epitaxy region 201 may include four layers. A first layer 210 is at a lowest level and has an average Ge concentration of about 20 percent, and a uniform boron concentration of about $2.1E20/cm^3$. An average Ge concentration of a giving layer is defined by dividing a sum of a Ge concentration at a top region of the giving layer and a Ge concentration at a bottom region of the giving layer by 2. A second layer 220 has a gradient concentration of Ge from about 27 to about 37 percent, and a uniform boron concentration of about $2.2E20/cm^3$. The third layer (not shown in FIG. 2) has an average concentration of Ge about 40 percent, and a uniform boron concentration of about $2.7E20/cm^3$. A forth layer (not shown in FIG. 2) may have a Ge concentration gradient of from about 41 to about 47 percent, and a uniform boron concentration of about $2.9E20/cm^3$.

An epitaxy region 201 is embedded with boron doped stressor material and covered by a cap layer 230. A SiGe in a source and drain region formed in a silicon substrate 200 is known to create an uni-axial compressive stress in a channel region between the drain and source region due to a lattice mismatch between the SiGe in the source and drain regions and substrate 200 material. This compressive stress increases carrier mobility (hole mobility) and thus improves transistor performance. Increased carrier mobility is especially important for MOSFET devices. When CMOS circuits, such as inverters are formed, it is preferred that a NMOS and a PMOS transistor have more or less symmetric performance characteristics. Enhancing MOS transistor performance by increasing carrier mobility thereby improves and balances an overall CMOS performance in a device.

Figure 3:
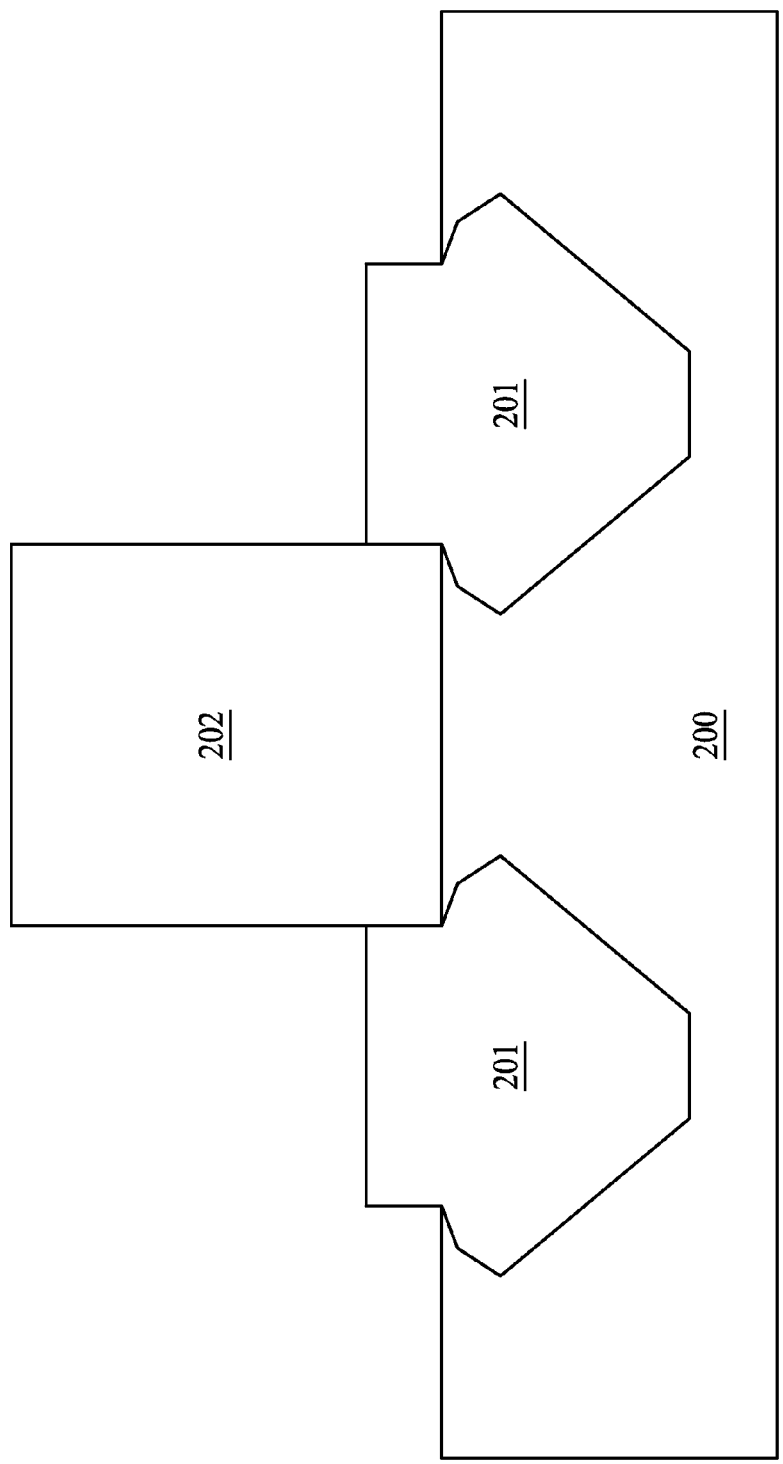
FIG. 3 is a cross sectional view of a transistor with an epitaxy regions and a gate, in accordance with some embodiments.

In another embodiment, as shown in FIG. 3, a gate 202 is disposed between an epitaxy region 201, which may be a source and a drain region. One or more gate 202 may be formed over a substrate 200. Gate 202 includes a gate stack and may include a sealing layer and other suitable structures. The gate stack has an interfacial layer, a gate dielectric layer, a gate electrode layer, and a hard mask layer. It is understood that the gate stack may include additional layers such as interfacial layers, capping layers, diffusion/barrier layers, dielectric layers, and conductive layers, other suitable layers, and/or combinations thereof. An interfacial layer may formed by any suitable process to any suitable thickness. An exemplary interfacial layer includes silicon oxide (e.g., thermal oxide or chemical oxide) and/or silicon oxynitride (SiON). The gate dielectric layer is formed over the interfacial layer by any suitable process. The gate dielectric layer may include a dielectric material, such as silicon oxide, silicon nitride, silicon oxynitride, and high-k dielectric material, other suitable dielectric material, and/or combinations thereof. Examples of high-k dielectric material includes HfO2, HfSiO, HfSiON, HfTaO, HfTiO, HfZrO, Zirconium oxide, aluminum oxide, hafnium dioxide-alumina (HfOZi Al2O3) alloy, other suitable high-k dielectric materials, and/or combinations thereof. The gate electrode layer is formed over the gate dielectric layer by any suitable process. The gate electrode layer includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. The hard mask layer may be formed over the gate electrode layer by any suitable process. The hard mask layer includes any suitable material, for example, silicon nitride, SiON, SiC, SiOC, spin-on glass (SOG), tetraethylorthosilicate (TEOS), plasma enhanced CVD oxide (PE-oxide), high-aspect-ratio-process (HARP) formed oxide, and/or other suitable material.

Figure 5:
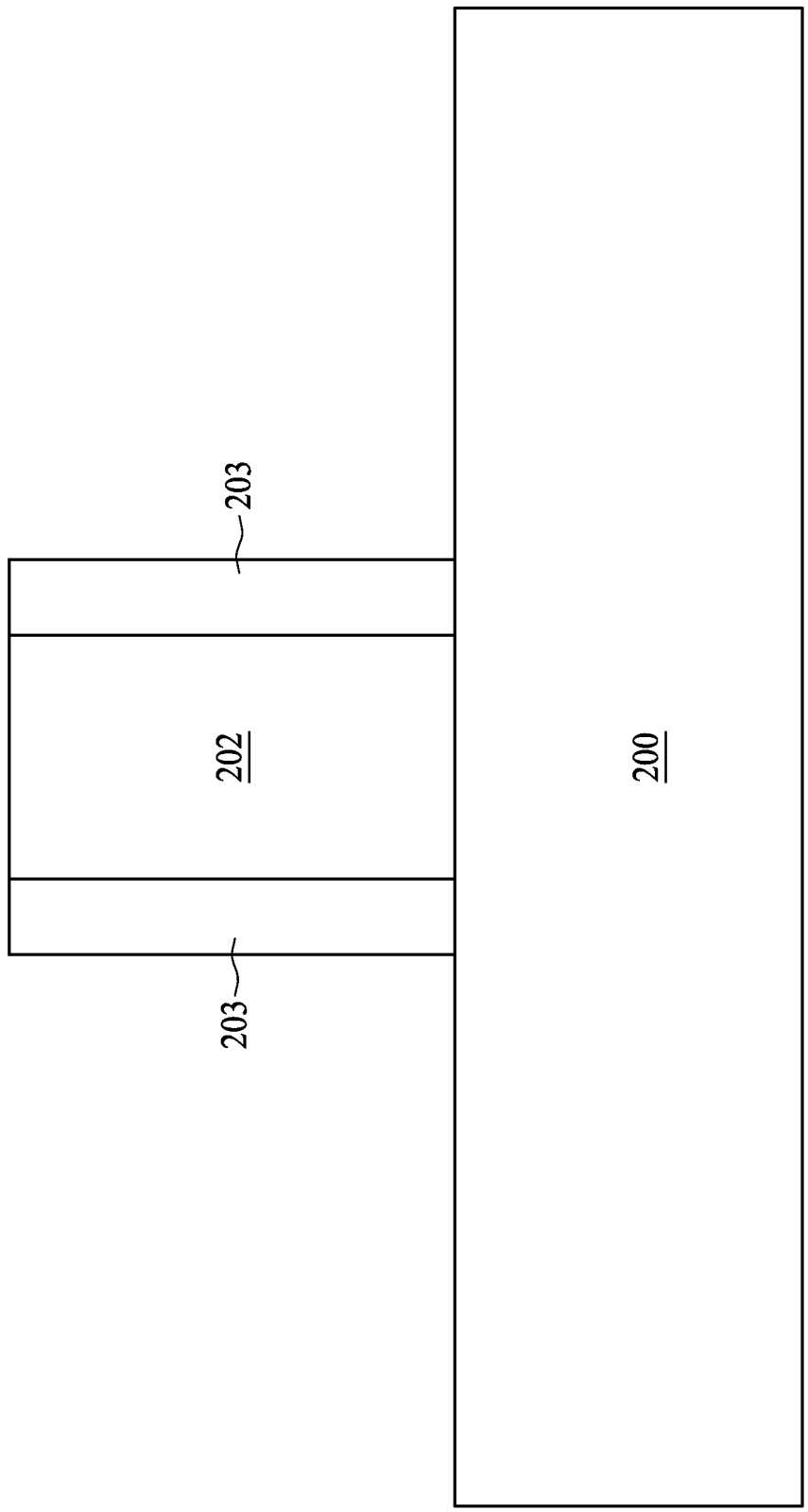
FIG. 5 to FIG. 9 are cross sectional views of an operation in a method for manufacturing a transistor with two epitaxy regions and a gate in between, in accordance with some embodiments of the present disclosure.

Referring to FIG. 5, gate spacer 203, which is positioned on each side of gate 202, may include a dielectric material, such as silicon nitride, silicon carbide, silicon oxynitride, other suitable materials, and/or combinations thereof. In some embodiments, gate spacer 203 is used to offset subsequently formed doped regions, such as source/drain regions. Gate spacer 203 may further be used for designing or modifying a profile of a junction of a source and drain region.

Figure 6:
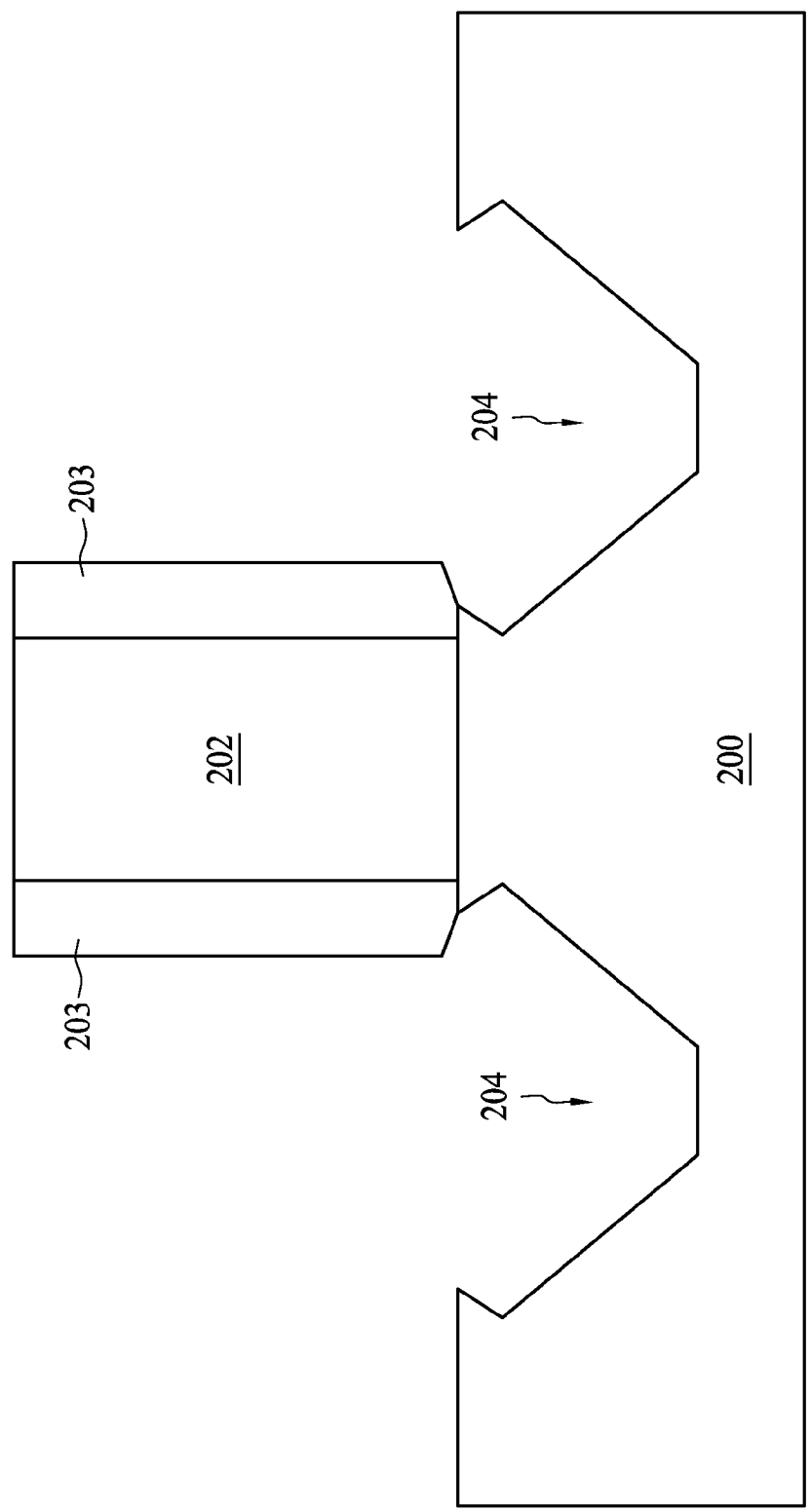

Referring to FIG. 6. A formation of a gate 202 or a gate spacer 203 could act as an etch mask for a recess 204 adjacent to the gate 202 or the gate spacer 203. A shape obtained for the recess 204 is "V shaped". This shape is selected to extend a SiGe stress in a channel region, or closer to the channel region in a portion of the source and drain regions. This shape creates a more effective compressive stress in the channel region. The recess 204 may have a predetermined depth corresponding to a bottom thickness H1 of a first layer 210 and a second layer 220 of an epitaxy region 201. In some embodiment, the recess 204 may also be a diamond-shaped recess or other polygonal shaped recess.

Figure 4:
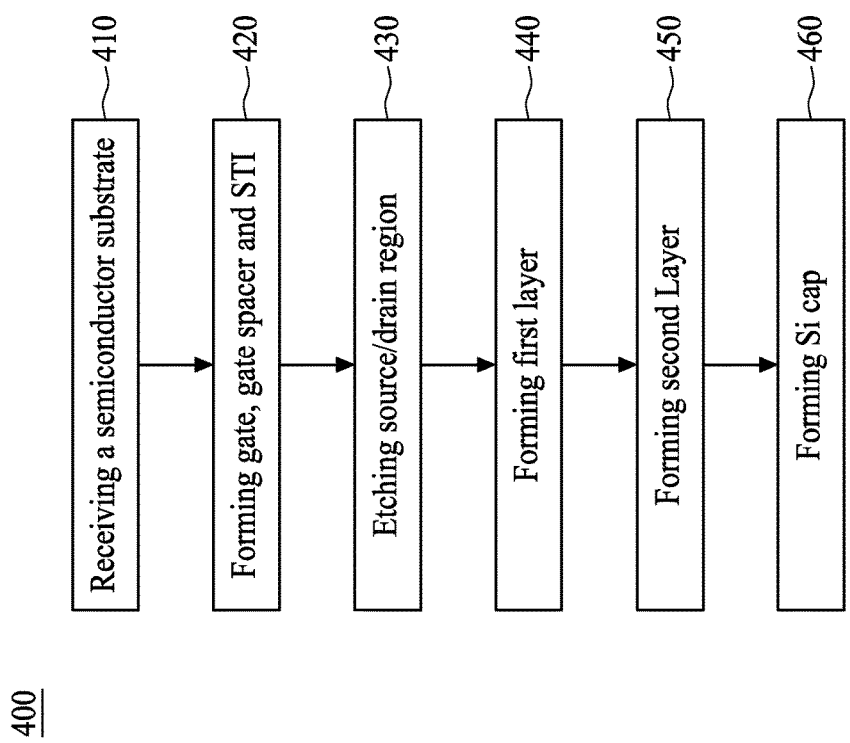
FIG. 4 is an operational flow of a method for manufacturing a semiconductor structure, in accordance with some embodiments.

Referring back to FIG. 4, operations for forming an epitaxy region 201 on a substrate 200 is described from an operation 410 to an operation 450. In FIG. 4 and FIG. 5, a gate stack of a gate 202 is formed by any suitable process or processes as part of an operation 420. For example, the gate stack can be formed by an operation including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), plating, other suitable methods, and/or combinations thereof. The photolithography patterning processes may be used for defining the boundary of the gate. The photolithography patterning processes include photoresist coating (e. g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion beam writing. The etching processes include dry etching, wet etching, and/or other etching methods (e.g., reactive ion etching).

In FIG. 4 and FIG. 6, each of a gate spacer 203 may include one or more layers, each including oxide, silicon nitride, silicon oxynitride (SiON) and/or other dielectric materials. As in an operation 420, gate spacer 203 may be formed using commonly used techniques, such as plasma enhanced chemical vapor deposition (PECVD), low-pressure chemical vapor deposition (LPCVD), sub-atmospheric chemical vapor deposition (SACVD), or a like. A formation of gate spacer 203 may include blanket forming several gate spacer layers, and then performing an etching operations to remove a horizontal portions of the gate spacer layers, so that a remaining vertical portions of the gate spacer layers could be formed. The gate spacer 203 may be formed for defining an edge of a recessed region. The gate 202 and the gate spacer 203 may act as an implant mask, and further source/drain implants may be performed after forming permanent electrode spacers. An etching operation may include a multiple-step etching to gain etch selectivity, flexibility and desired etch profile.

A formation of a STI features, as in the operation 420, may include etching a trench in a substrate 200 and filling the trench by insulator materials such as silicon oxide, silicon nitride, or silicon oxynitride. The filled trench may have a multi-layer structure such as a thermal oxide liner layer with silicon nitride filling the trench. The STI structure may be created using a process sequence such as growing a pad oxide, forming a low pressure chemical vapor deposition (LPCVD) nitride layer, patterning an STI opening using photoresist and masking, etching a trench in a substrate 200, optionally growing a thermal oxide trench liner to improve a trench interface, filling the trench with oxide, using chemical mechanical planarization (CMP) to etch back, and using nitride stripping to leave the STI structure. An annealing process may be performed after the formation of a STI.

In FIG. 4 and FIG. 6, after forming a gate 202, a gate spacer 203, and STI, a recess 204 could be formed as shown in an operation 430 following the operation 420. The recess 204 may be adjacent to the gate 202 and provide a region wherein a source/drain region will be disposed. In some embodiments, one or more photolithography processes are used to form the recess 204 by masking elements such that several remaining regions of a substrate 200 are protected from an etching process. The photolithography process may include forming a photoresist layer (resist) overlying the substrate 200 (e.g., on a silicon layer), exposing the resist to a pattern, performing post-exposure bake processes, and developing the resist to form a masking element including the resist. The masking element may then be used to protect regions of the substrate 200 while an etch process forms a recess 204 into the silicon layer. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion beam writing. In yet another alternative, a lithography process could implement nanoimprint technology.

Area not protected by the masking element is etched by various methods, including a dry etch, a wet etch, or a combination of dry etch and wet etch. The dry etching process may implement fluorine-containing gas (e.g., CF4, SP6, CH2F2, CHF3, and/or C2F6), chlorine-containing gas (e.g., C12, CHC13, CC14, and/or BC13), bromine-containing gas (e.g., HBr and/or CHBR3), oxygy-containing gas, iodine-containing gas, other suitable gases and/or plasmas, or combinations thereof. For an example embodiment in which a gate electrode material is poly-crystalline silicon and a gate dielectric material is an oxide, the etching process may be a wet or dry, anisotropic or isotropic, etch process. For the anisotropic process a reactive ion etching (RIE) processes may be performed. Another anisotropic process such as a Deep reactive-ion etching (DRIE) may also be used. One type of DRIE is cryogenic etching, which may include sidewall passivation such as a SiOxFy functional groups (which originate from sulphur hexafluoride and oxygen etch gases) condense on a sidewalls, and protect them from lateral etching. The DRIE process may also include deposition of a chemically inert passivation layer. (For instance, C4F8 (Octafluorocyclobutane) source gas yielding a substance similar to Teflon.) A pre-baking process accompanied with hydrogen imported is preformed to clean a surface of recess 204.

Figure 7:
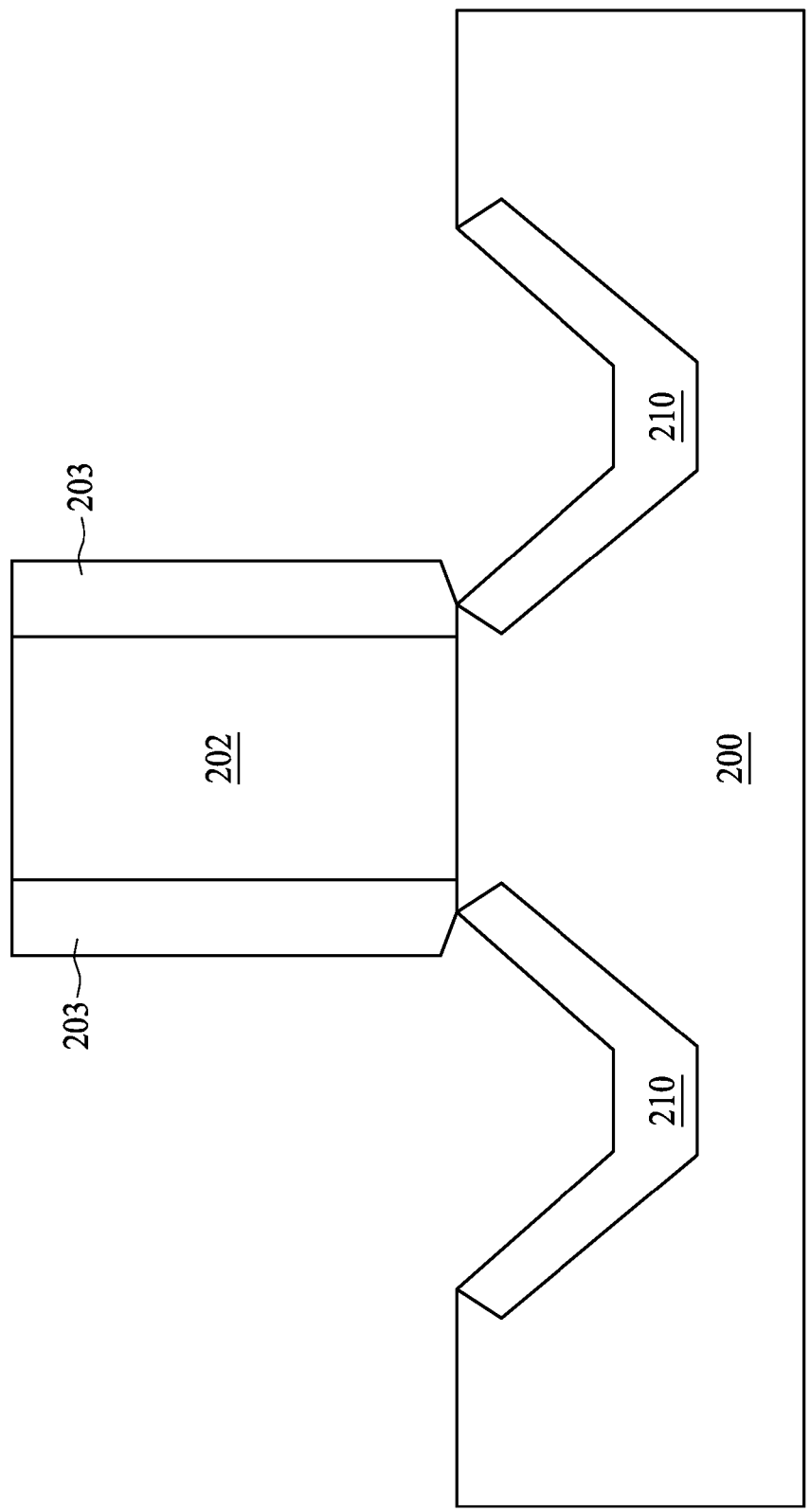
Figure 8:
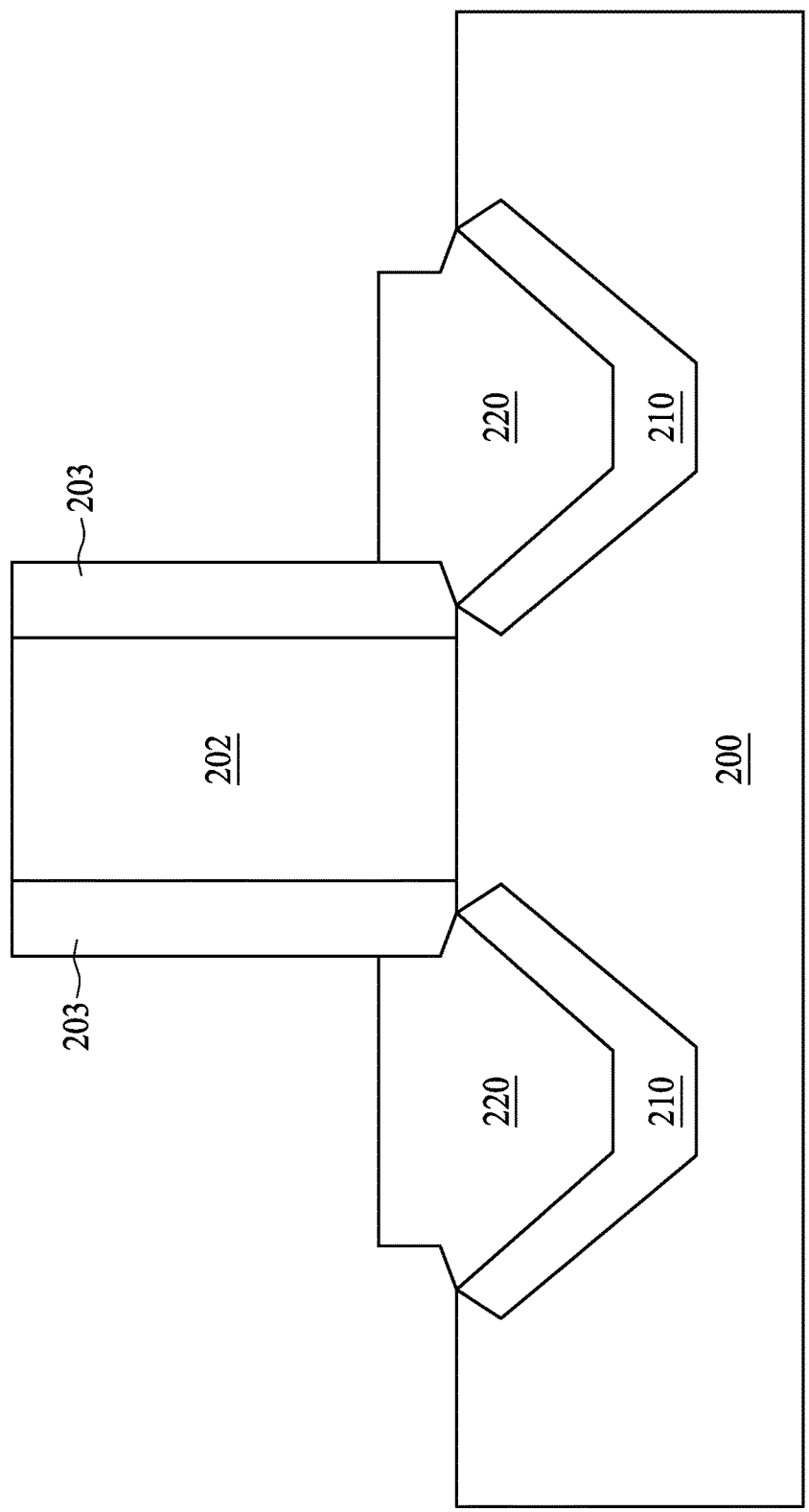

Referring to FIG. 4 and FIG. 7, after a formation of a recess 204, a first layer 210 and a second layer 220 could be grown in recess 204 region as shown in operation 440 and operation 450 in FIG. 4, and as also shown in FIG. 7 and a FIG. 8. To determine an optimum condition for growing SiGe, an etch-back to growth ratio (also referred to as etch-to-growth ratio, or E/G ratio) may be used to define a process conditions. The E/G ratio is a ratio of a partial pressure of etch-back gas(es) (such as HCl) to a weighted partial pressure of growth gas(es) (such as GeH4 for Ge supply source, and for Si supply source includes DCS, SiH2Cl2, SiH4, Si2H6, or a combination thereof). In an exemplary embodiment in which GeH4, HCl, and DCS are used, an E/G ratio may be expressed as a function of partial pressures of HCl, DCS, and GeH4. An accurate estimated weight of GeH4 may need to be found through experiments. It was observed that GeH4 has a much higher effect to a growth than DCS. In other words, to increase a growth rate, it is much more effective to introduce more GeH4 than to introduce more DCS. Alternatively, under constant temperature and total volume of HCl, DCS, and GeH4, an E/G ratio may be a function of several flow rates of several process gases with the flow rates of HCl, DCS, and GeH4, respectively. An accurate estimated weight of GeH4 may need to be found through experiments. Accordingly, experiments may be performed to find a process conditions including a process gases and a partial pressures (or flow rates) for a growth/etching processes for each layer. Several flow rates of process gases may be changed gradually to reduce an abrupt change in a composition. In some SiGe regions. an E/G ratio may be a function of time. In some embodiment, increasing an E/G ratio gradually may increases a growth rates, and therefore, achieves a thicker SiGe region than a SiGe region with lower growth rates. An adjustment of thicknesses may be achieved by adjusting durations of an epitaxy process and/or an E/G ratio throughout manufacturing processes.

Referring to FIG. 4 and FIG. 8, in some embodiments, a second layer 220 may be a SiGe regions doped with boron, wherein B2H6 doping gases are used as precursors. During an epitaxial growth by selective epitaxy growth (SEG), with growth and etch co-exist. In different epitaxy stages of several embodiments, a growth rate may be greater than or smaller than an etch rate, and hence a corresponding net effects may be growth or etching. In some embodiments, SEG is performed using low pressure chemical vapor deposition (LPCVD) in a chamber. A boron doping concentration may also be different at different regions within a second layer 220, as shown in second layer 220 with dotted separating line for different regions in FIG. 9. A selective etching reduces or substantially removes a likely abnormal growth of SiGe regions, so that SiGe regions may have an improved quality. Besides, the selective etching could reduce SiGe region abnormal growth due to layout or other process excursions. Although epitaxial growth of SiGe is preferable; however, other forms of disposing SiGe into a recess 204 regions may be used. An epitaxial process used to deposit an embedded stressor layers in source/drain regions may include chemical vapor deposition, ultra-high vacuum chemical vapor deposition (UHV-CVD), or molecular beam epitaxy (MBE).

Figure 9:
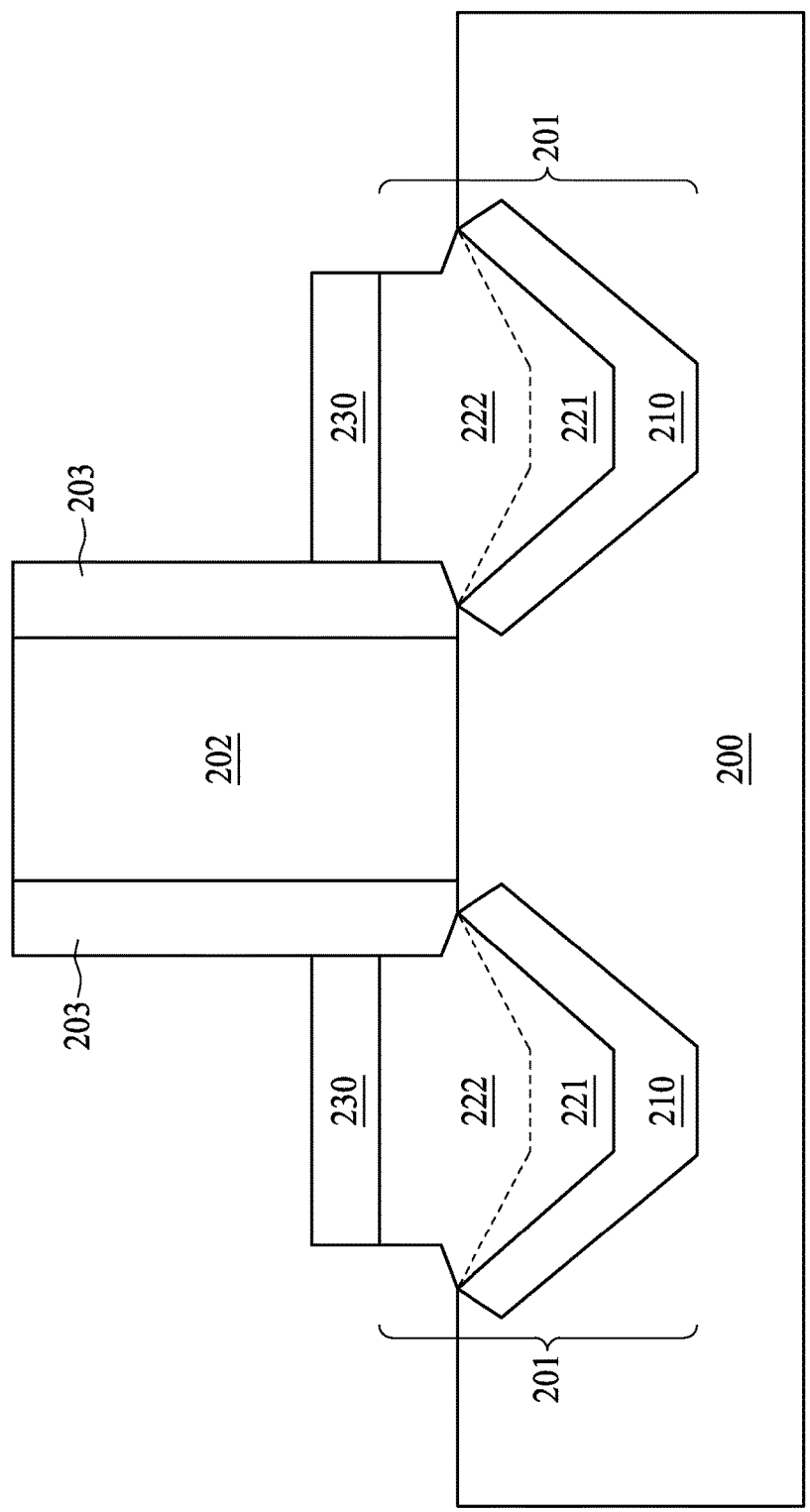

Referring to FIG. 4 and FIG. 9, a top most layer is a cap layer 230, which is formed last as shown in an operation 460. A formation of silicon caps or SiGe caps, which may also be formed using SEG. Several process gases for forming silicon-containing caps may include silane ($SiH_4$) and HCl. As discussed previously, in a selective growth of silicon-containing caps, both growth and etch back exist, while a net effect is growth. Facets may also be formed on silicon-containing caps. Accordingly, similar to a formation of SiGe regions, after a selective growth of silicon-containing caps, an optional selective etch-back may be performed to reduce a pattern-loading effect and to improve a profiles of silicon containing caps. A selective etch back of silicon-containing caps may be in-situ performed with a respective selective growth. A transition from selective growth to selective etch-back may be achieved by adjusting a process conditions such as increasing a partial pressure of HCl and/or reducing a partial pressure of silane. The cap layer 230 may also be doped with positive boron dopant by in-situ doping method.

In an embodiment, impurities are added to epitaxy region 201 during a growth (e.g., in-situ doping). Exemplary dopants include arsenic, phosphorous, antimony, boron, boron di-fluoride, and/or other possible impurities. Sources for boron include diborane (B2H6) gas used during SiGe epitaxy, and BF2, for example. Methods other than epitaxial growth of embedded stressor may be implemented in accordance with an illustrative embodiment. Boron doped in a SiGe may be accomplished by introducing boron-containing gas, in an in-situ fashion, to an epitaxial SiGe growth. Boron or other dopants may also be formed by implantation operations.

Additional layer of doped SiGe may be formed within an epitaxy region 201 to further enhance performance. For example, a second layer 220 may have a boron doping concentration at a bottom portion 221 of around $2E19/cm^3$ and a top portion 222 around $3E19/cm^3$. By controlling a Ge concentration throughout a SiGe epitaxial growth operations as previously described in the present disclosure, a short channel effects and junction leakage problems observed in conventional approaches may be reduced or eliminated. Although several embodiments mentioned above are described with respect to illustrative examples in a specific context, namely SiGe, epitaxially grown, embedded stressors for source/drain regions in PMOS transistors, a concept may also be applied, however, to other semiconductor devices including other stressor materials, for example SiC and a like in an NMOS transistor.

Figure 10:
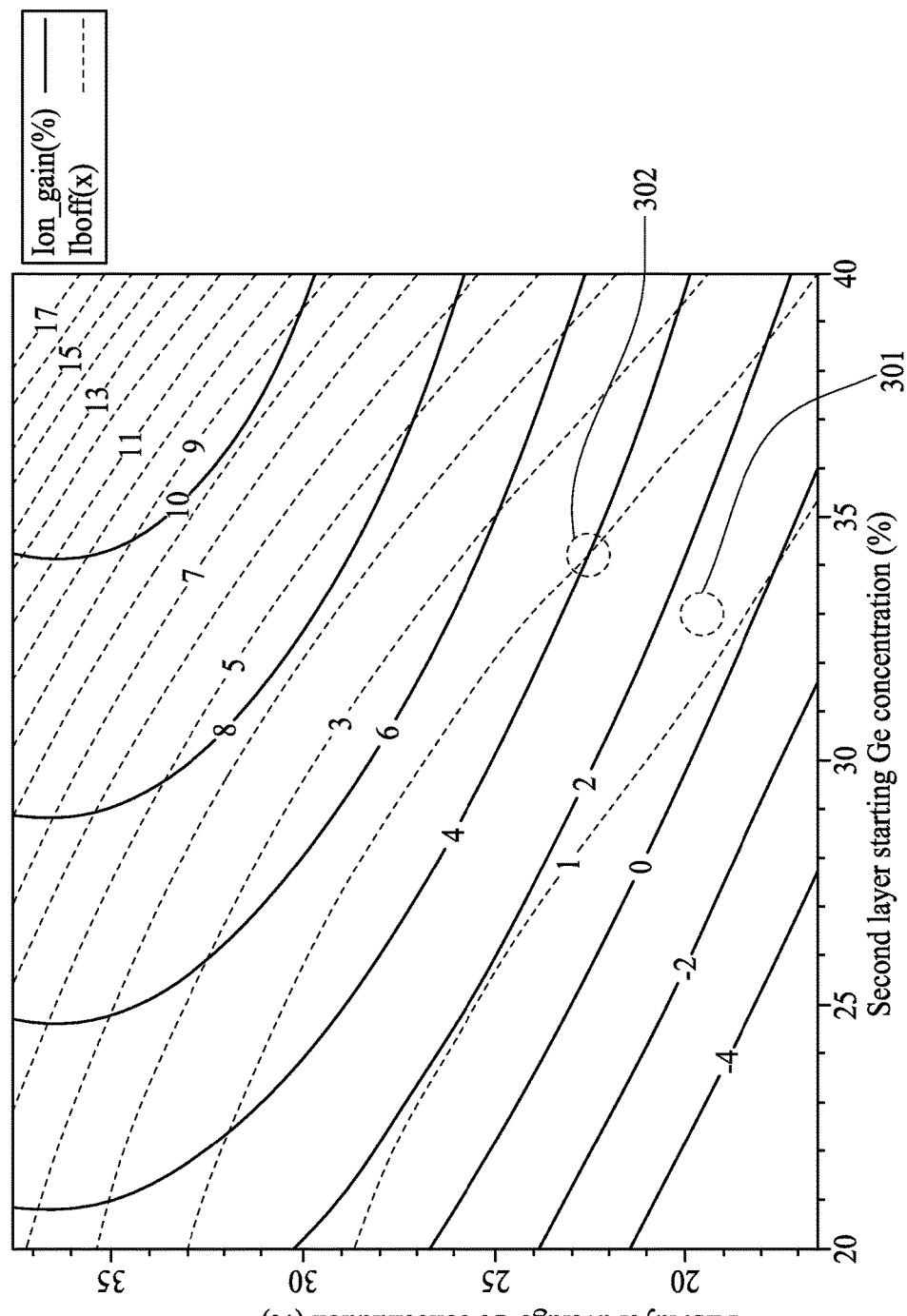
FIG. 10 illustrates a relationship between a concentration profile of an epitaxy region and a current gain, in accordance with some embodiments of the present disclosure.

Referring to FIG. 10, FIG. 10 is a contour map showing a Ge concentration profile of a first layer 210 and a second layer 220 in relation to a driving current (denoted as Ion Gain hereinafter) respectively and a leakage current (denoted as Iboff hereinafter). When both an average Ge concentration in first layer 210 and a starting Ge concentration in a second layer 220 increase, an Ion Gain, shown in solid contour line, increases as well. However, when both the average Ge concentration in the first layer 210 and the starting Ge concentration in the second layer 220 increase, the Iboff, shown in dotted contour line, increases as well.

In one embodiment as represented by a point 301, a first layer 210 has an average Ge concentration of about 20 percent. The first layer 210 also has a bottom thickness of about 18 nanometers and a lateral thickness of about 9 nanometers (not shown in FIG. 10). A second layer 220 has a starting Ge concentration of about 33 percent. The second layer 220 also may have a boron doping concentration of about $2.2E20/cm^3$. This embodiment would yield an Ion close to 2 and an Iboff close to 1 according to FIG. 10.

In another embodiment as represented by a point 302, a first layer 210 has an average Ge concentration of about 23 percent. The first layer 210 also has a bottom thickness of about 18 nanometers and a lateral thickness of about 9 nanometers (not shown in FIG. 10). A second layer 220 has a starting Ge concentration of about 34 percent. The second layer 220 also may have a boron doping concentration of about $2.2E20/cm^3$. This embodiment would yield an Ion of approximately 4 and an Iboff of approximately 2 as according to FIG. 10.

From these two embodiments represented by point 301 and point 302, both having a same boron doping concentration and a same thickness for a first layer, a comparison could be made to understand how a Ge concentration profile could affect an outcome of a driving current and a leakage current of a transistor. Therefore, an adjustment of a concentration profile could optimize a performance of a device.

Some embodiments of the present disclosure provide a semiconductor structure including a substrate and an epitaxy region partially disposed in the substrate. The epitaxy region includes a substance with a lattice constant that is larger than a lattice constant of the substrate. The concentration profile of the substance in the epitaxy region shows a monotonically increase from a bottom portion of the epitaxy region to a top portion of the epitaxy region. The epitaxy region also includes a multilayer structure. A first layer of the multilayer structure has a height to width ratio of about 2. The first layer is a layer positioned closest to the substrate, and the first layer has an average concentration of the substance from about 20 to 32 percent. A second layer is positioned over the first layer. A bottom portion of a second layer has an average concentration of the substance from about 27 to 37 percent.

In some embodiments of the present disclosure, the substance is selected from a group four element in a periodic table In some embodiments of the present disclosure, the bottom thickness of the first layer is from about 14 nanometers to about 17 nanometers.

In some embodiments of the present disclosure, the bottom portion includes a vertical thickness of from about 9 nanometers to about 14 nanometers.

In some embodiments of the present disclosure, the dopant in the second layer includes a doping concentration from about $1.8E20/cm^3$ to about $2.6E20/cm^3$.

In some embodiments of the present disclosure, the first layer includes a dopant at a doping concentration below $1E19/cm^3$.

In some embodiments of the present disclosure, the semiconductor structure in the present disclosure further includes at least a gate and a spacer on the substrate and in proximity to the epitaxy region.

Some embodiments of the present disclosure provide a semiconductor structure including a gate, a substrate, and an epitaxy region. The epitaxy region is positioned in at least one of a drain region and a source region near the gate. The epitaxy region includes a germanium concentration profile that is monotonically increasing from a bottom portion to a top portion. A multilayer structure including a first layer and a second layer. The first layer is closest to the substrate. The first layer has a height to width ratio of about 2. The first layer has an average germanium concentration from about 20 to 32 percent. The second layer is above the first layer. A bottom portion of the second layer has an average germanium concentration from about 27 to 37 percent.

In some embodiments of the present disclosure, the vertical thickness of the first layer is from about 14 nanometers to about 17 nanometers.

In some embodiments of the present disclosure, the bottom portion includes a vertical thickness of from about 9 nanometers to about 14 nanometers.

In some embodiments of the present disclosure, the second layer includes a boron concentration of from about $1.8E20/cm^3$ to about $2.6E20/cm^3$.

In some embodiments of the present disclosure, the germanium concentration in the second layer includes a grading profile.

In some embodiments of the present disclosure, the first layer further includes a boron doping concentration below 1E19/cm$^3$.

In some embodiments of the present disclosure, the germanium concentration in the first layer includes a grading profile with a difference between a greatest concentration and a lowest concentration being 10 percent.

Some embodiments of the present disclosure provide a method for manufacturing a semiconductor structure. The method includes forming a recess in a substrate, and forming an epitaxy region. The method of forming an epitaxy region includes forming a multilayer structure with a substance having a first lattice constant larger than a second lattice constant of the substrate. Forming a first layer near the substrate with an average concentration of the substance from about 20 to about 32 percent is by an in situ growth. A second layer is formed over the first layer. A bottom portion of the second layer has a concentration of the substance from about 27 percent to about 37 percent by an in situ growth operation. A dopant is formed in the first layer and the second layer.

In some embodiments of the present disclosure, the forming the recess includes etching the substrate by a wet etching, a dry etching, or a combination thereof.

In some embodiments of the present disclosure, the forming the epitaxy region includes performing a cyclic deposition etch operation, a selective epitaxial growth, or a combination thereof.

In some embodiments of the present disclosure, forming dopants in the first layer includes performing an in situ doping or an ion-implantation operation with a dopant selected from a group consisting essentially of III-V elements.

In some embodiments of the present disclosure, forming dopants in the second layer includes performing an in situ doping or an ion-implantation operation using boron.

In some embodiments of the present disclosure, including forming a cap layer with substantially the second lattice constant over the second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate; and
an epitaxy region, partially disposed in the substrate, comprising
a substance with a first lattice constant larger than a second lattice constant of the substrate; a concentration profile of the substance being monotonically increased from a portion closest to the substrate to a portion further away from the substrate; and
a multilayer structure, each layer thereof having an average concentration of the substance different from other layers, the multilayer structure comprising:
a first layer in proximity to an interface between the epitaxy region and the substrate, and the average concentration of the substance in the first layer is from about 20 to about 32 percent, the first layer comprising:
a bottom thickness; and
a lateral thickness,
wherein a thickness ratio of the bottom thickness and the lateral thickness is about 2; and
a second layer, positioned over the first layer, comprising
a bottom portion, having a concentration of the substance from about 27 percent to about 37 percent; and
a dopant.

2. The semiconductor structure of claim 1, wherein the substance is selected from a group four element in a periodic table.

3. The semiconductor structure of claim 1, wherein the bottom thickness of the first layer is from about 14 nanometers to about 17 nanometers.

4. The semiconductor structure of claim 1, wherein the bottom portion comprises a vertical thickness of from about 9 nanometers to about 14 nanometers.

5. The semiconductor structure of claim 1, wherein the dopant in the second layer comprises a doping concentration from about 1.8E20/cm$^3$ to about 2.6E20/cm$^3$.

6. The semiconductor structure of claim 1, wherein the first layer comprises a dopant at a doping concentration below 1E19/cm$^3$.

7. The semiconductor structure of claim 1, further comprising at least a gate and a spacer on the substrate and in proximity to the epitaxy region.

8. A semiconductor structure, comprising:
a gate on top of a substrate; and
an epitaxy region, disposed in at least one of a drain region and a source region in proximity to the gate, the epitaxy region comprising:
a germanium concentration profile being monotonically increased from a portion closest to the substrate to a portion further away from the substrate; and
a multilayer structure comprising:
a first layer in proximity to an interface between the epitaxy region and the substrate; and
an average germanium concentration in the first layer is from about 20 to about 32 percent, the first layer comprising:
a bottom thickness; and
a lateral thickness,
wherein a thickness ratio of the bottom thickness and the lateral thickness is about 2; and
a second layer, positioned over the first layer, comprising:
a bottom portion, having a germanium concentration from about 27 percent to about 37 percent.

9. The semiconductor structure of claim 8, wherein the bottom thickness of the first layer is from about 14 nanometers to about 17 nanometers.

10. The semiconductor structure of claim 8, wherein the bottom portion comprises a vertical thickness of from about 9 nanometers to about 14 nanometers.

11. The semiconductor structure of claim 8, wherein the second layer comprises a boron concentration of from about $1.8E20/cm^3$ to about $2.6E20/cm^3$.

12. The semiconductor structure of claim 8, wherein the germanium concentration in the second layer comprises a grading profile.

13. The semiconductor structure of claim 8, wherein the first layer further comprises a boron doping concentration below $1E19/cm^3$.

14. The semiconductor structure of claim 8, wherein the germanium concentration in the first layer comprises a grading profile with a difference between a greatest concentration and a lowest concentration being 10 percent.

* * * * *